(12) United States Patent
Sun et al.

(10) Patent No.: US 11,862,726 B2
(45) Date of Patent: Jan. 2, 2024

(54) TRANSISTOR, INTEGRATED CIRCUIT, AND MANUFACTURING METHOD OF TRANSISTOR

(71) Applicant: Taiwan Semiconductor Manufacturing Company, Ltd., Hsinchu (TW)

(72) Inventors: Hung-Chang Sun, Kaohsiung (TW); Sheng-Chih Lai, Hsinchu County (TW); Yu-Wei Jiang, Hsinchu (TW); Kuo-Chang Chiang, Hsinchu (TW); Tsuching Yang, Taipei (TW); Feng-Cheng Yang, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/401,315

(22) Filed: Aug. 13, 2021

(65) Prior Publication Data

US 2023/0049651 A1 Feb. 16, 2023

(51) Int. Cl.
*H01L 29/78* (2006.01)
*H01L 29/66* (2006.01)
*H10B 51/00* (2023.01)

(52) U.S. Cl.
CPC .... *H01L 29/78391* (2014.09); *H01L 29/6684* (2013.01); *H10B 51/00* (2023.02)

(58) Field of Classification Search
CPC ......... H01L 29/78391; H01L 27/11585; H01L 29/6684
See application file for complete search history.

(56) References Cited

U.S. PATENT DOCUMENTS

| | | | | |
|---|---|---|---|---|
| 2018/0286987 | A1* | 10/2018 | Lee | H01L 29/66969 |
| 2018/0374929 | A1* | 12/2018 | Yoo | H01L 29/516 |
| 2019/0333920 | A1* | 10/2019 | Chen | H01L 21/31144 |
| 2020/0227519 | A1* | 7/2020 | Song | H01L 29/66969 |
| 2022/0209018 | A1* | 6/2022 | Vega | H01L 27/092 |

* cited by examiner

*Primary Examiner* — Julia Slutsker
(74) *Attorney, Agent, or Firm* — JCIPRNET

(57) ABSTRACT

A transistor includes an insulating layer, a source region, a drain region, a channel layer, a ferroelectric layer, an interfacial layer, and a gate electrode. The source region and the drain region are respectively disposed on two opposite ends of the insulating layer. The channel layer is disposed on the insulating layer, the source region, and the drain region. The ferroelectric layer is disposed over the channel layer. The interfacial layer is sandwiched between the channel layer and the ferroelectric layer. The gate electrode is disposed on the ferroelectric layer.

20 Claims, 14 Drawing Sheets

TRANSISTOR, INTEGRATED CIRCUIT, AND MANUFACTURING METHOD OF TRANSISTOR

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
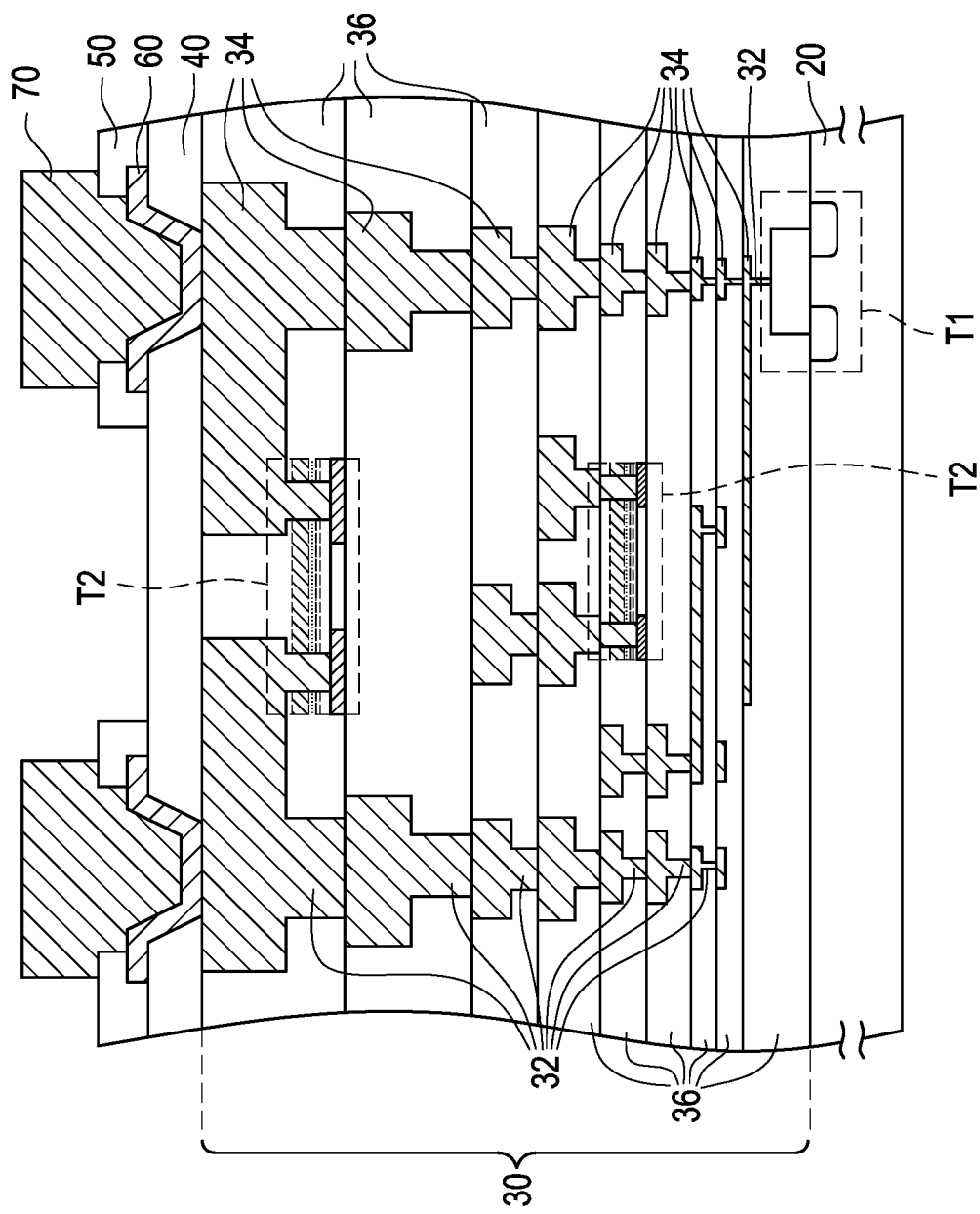
FIG. 1 is a schematic cross-sectional view of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of an integrated circuit IC in accordance with some embodiments of the disclosure. In some embodiments, the integrated circuit IC includes a substrate 20, an interconnect structure 30, a passivation layer 40, a post-passivation layer 50, a plurality of conductive pads 60, and a plurality of conductive terminals 70. In some embodiments, the substrate 20 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 20 may be a bulk silicon substrate, a silicon-on-insulator (SOI) substrate, or a germanium-on-insulator (GOI) substrate.

In some embodiments, the substrate 20 includes various doped regions depending on circuit requirements (e.g., p-type semiconductor substrate or n-type semiconductor substrate). In some embodiments, the doped regions are doped with p-type or n-type dopants. For example, the doped regions may be doped with p-type dopants, such as boron or $BF_2$; n-type dopants, such as phosphorus or arsenic; and/or combinations thereof. In some embodiments, these doped regions serve as source/drain regions of a first transistor T1, which is over the substrate 20. Depending on the types of the dopants in the doped regions, the first transistor T1 may be referred to as n-type transistor or p-type transistor. In some embodiments, the first transistor T1 further includes a metal gate and a channel under the metal gate. The channel is located between the source region and the drain region to serve as a path for electron to travel when the first transistor T1 is turned on. On the other hand, the metal gate is located above the substrate 20 and is embedded in the interconnect structure 30. In some embodiments, the first transistor T1 is formed using suitable Front-end-of-line (FEOL) process. For simplicity, one first transistor T1 is shown in FIG. 1. However, it should be understood that more than one first transistors T1 may be presented depending on the application of the integrated circuit IC. When multiple first transistors T1 are presented, these first transistors T1 may be separated by shallow trench isolation (STI; not shown) located between two adjacent first transistors T1.

As illustrated in FIG. 1, the interconnect structure 30 is disposed on the substrate 20. In some embodiments, the interconnect structure 30 includes a plurality of conductive vias 32, a plurality of conductive patterns 34, a plurality of dielectric layers 36, and a plurality of second transistors T2. As illustrated in FIG. 1, the conductive patterns 34 and the conductive vias 32 are embedded in the dielectric layers 36. In some embodiments, the conductive patterns 34 located at different level heights are connected to one another through the conductive vias 32. In other words, the conductive patterns 34 are electrically connected to one another through the conductive vias 32. In some embodiments, the bottommost conductive vias 32 are connected to the first transistor T1. For example, the bottommost conductive vias 32 are connected to the metal gate, which is embedded in the bottommost dielectric layer 36, of the first transistor T1. In other words, the bottommost conductive vias 32 establish electrical connection between the first transistor T1 and the conductive patterns 34 of the interconnect structure 30. As illustrated in FIG. 1, the bottommost conductive via 32 is connected to the metal gate of the first transistor T1. It should be noted that in some alternative cross-sectional views, other bottommost conductive vias 32 are also connected to source/drain regions of the first transistor T1. That is, in some embodiments, the bottommost conductive vias 32 may be referred to as "contact structures" of the first transistor T1.

In some embodiments, a material of the dielectric layers 36 includes polyimide, epoxy resin, acrylic resin, phenol resin, benzocyclobutene (BCB), polybenzooxazole (PBO), or any other suitable polymer-based dielectric material. Alternatively, the dielectric layers 36 may be formed of oxides or nitrides, such as silicon oxide, silicon nitride, or the like. The dielectric layers 36 may be formed by suitable fabrication techniques such as spin-on coating, chemical vapor deposition (CVD), plasma-enhanced chemical vapor deposition (PECVD), or the like.

In some embodiments, a material of the conductive patterns 34 and the conductive vias 32 includes aluminum, titanium, copper, nickel, tungsten, or alloys thereof. The conductive patterns 34 and the conductive vias 32 may be formed by electroplating, deposition, and/or photolithography and etching. In some embodiments, the conductive patterns 34 and the underlying conductive vias 32 are formed simultaneously. It should be noted that the number of the dielectric layers 36, the number of the conductive patterns 34, and the number of the conductive vias 32 illustrated in FIG. 1 are merely for illustrative purposes, and the disclosure is not limited thereto. In some alternative embodiments, fewer or more layers of the dielectric layers 36, the conductive patterns 34, and/or the conductive vias 32 may be formed depending on the circuit design.

In some embodiments, the second transistors T2 are embedded in the interconnection structure 30. For example, each second transistor T2 is embedded in one of the dielectric layer 36. In some embodiments, the second transistors T2 are electrically connected to the conductive patterns 34 through the corresponding conductive vias 32. The formation method and the structure of the second transistors T2 will be described in detail later.

As illustrated in FIG. 1, the passivation layer 40, the conductive pads 60, the post-passivation layer 50, and the conductive terminals 70 are sequentially formed on the interconnect structure 30. In some embodiments, the passivation layer 40 is disposed on the topmost dielectric layer 36 and the topmost conductive patterns 34. In some embodiments, the passivation layer 40 has a plurality of openings partially exposing each topmost conductive pattern 34. In some embodiments, the passivation layer 40 is a silicon oxide layer, a silicon nitride layer, a silicon oxy-nitride layer, or a dielectric layer formed by other suitable dielectric materials. The passivation layer 40 may be formed by suitable fabrication techniques such as HDP-CVD, PECVD, or the like.

In some embodiments, the conductive pads 60 are formed over the passivation layer 40. In some embodiments, the conductive pads 60 extend into the openings of the passivation layer 40 to be in direct contact with the topmost conductive patterns 34. That is, the conductive pads 60 are electrically connected to the interconnect structure 30. In some embodiments, the conductive pads 60 include aluminum pads, copper pads, titanium pads, nickel pads, tungsten pads, or other suitable metal pads. The conductive pads 60 may be formed by, for example, electroplating, deposition, and/or photolithography and etching. It should be noted that the number and the shape of the conductive pads 60 illustrated in FIG. 1 are merely for illustrative purposes, and the disclosure is not limited thereto. In some alternative embodiments, the number and the shape of the conductive pads 60 may be adjusted based on demand.

In some embodiments, the post-passivation layer 50 is formed over the passivation layer 40 and the conductive pads 60. In some embodiments, the post-passivation layer 50 is formed on the conductive pads 60 to protect the conductive pads 60. In some embodiments, the post-passivation layer 50 has a plurality of contact openings partially exposing each conductive pad 60. The post-passivation layer 50 may be a polyimide layer, a PBO layer, or a dielectric layer formed by other suitable polymers. In some embodiments, the post-passivation layer 50 is formed by suitable fabrication techniques such as HDP-CVD, PECVD, or the like.

As illustrated in FIG. 1, the conductive terminals 70 are formed over the post-passivation layer 50 and the conductive pads 60. In some embodiments, the conductive terminals 70 extend into the contact openings of the post-passivation layer 50 to be in direct contact with the corresponding conductive pad 60. That is, the conductive terminals 70 are electrically connected to the interconnect structure 30 through the conductive pads 60. In some embodiments, the conductive terminals 70 are conductive pillars, conductive posts, conductive balls, conductive bumps, or the like. In some embodiments, a material of the conductive terminals 70 includes a variety of metals, metal alloys, or metals and mixture of other materials. For example, the conductive terminals 70 may be made of aluminum, titanium, copper, nickel, tungsten, tin, and/or alloys thereof. The conductive terminals 70 are formed by, for example, deposition, electroplating, screen printing, or other suitable methods. In some embodiments, the conductive terminals 70 are used to establish electrical connection with other components (not shown) subsequently formed or provided.

As mentioned above, the second transistors T2 are embedded in the interconnection structure 30. Taking the topmost second transistor T2 shown in FIG. 1 as an example, the formation method and the structure of this second transistor T2 will be described below in conjunction with FIG. 2A to FIG. 2J.

Figure 2A:
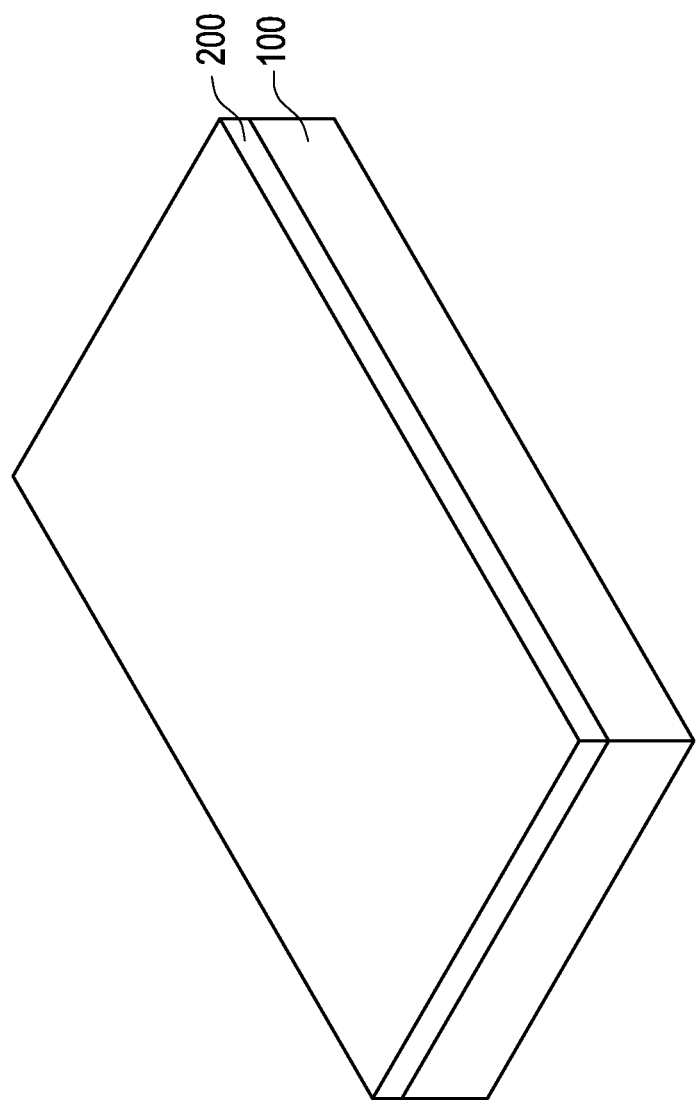
FIG. 2A to FIG. 2J are schematic perspective views illustrating various stages of a manufacturing method of the second transistor in FIG. 1.

FIG. 2A to FIG. 2J are schematic perspective views illustrating various stages of a manufacturing method of the second transistor T2 in FIG. 1. Referring to FIG. 2A, a dielectric layer 100 is provided. In some embodiments, the dielectric layer 100 is one of the dielectric layers 36 of the interconnection structure 30 of FIG. 1, so the detailed descriptions thereof is omitted herein. Thereafter, an insulating layer 200 is formed on the dielectric layer 100. In some embodiments, the insulating layer 200 is formed on the dielectric layer 100 such that a top surface of the dielectric layer 100 is covered by the insulating layer 200. A material of the insulating layer 200 may be the same as or different from the material of the dielectric layer 100. In some embodiments, the insulating layer 200 is formed of a low-k dielectric material having a dielectric constant (k-value) lower than about 3.0, about 2.5, or even lower. In some embodiments, the insulating layer 200 is formed of non-low-k dielectric materials such as silicon oxide, silicon carbide (SiC), silicon carbo-nitride (SiCN), silicon oxy-carbo-nitride (SiOCN), or the like. In some alternative embodiments, the material of the insulating layer 200 includes polyimide, epoxy resin, acrylic resin, phenol resin, BCB, PBO, or any other suitable polymer-based dielectric material. The insulating layer 200 may be formed by suitable fabrication techniques such as spin-on coating, CVD, PECVD, or the like.

Figure 2B:
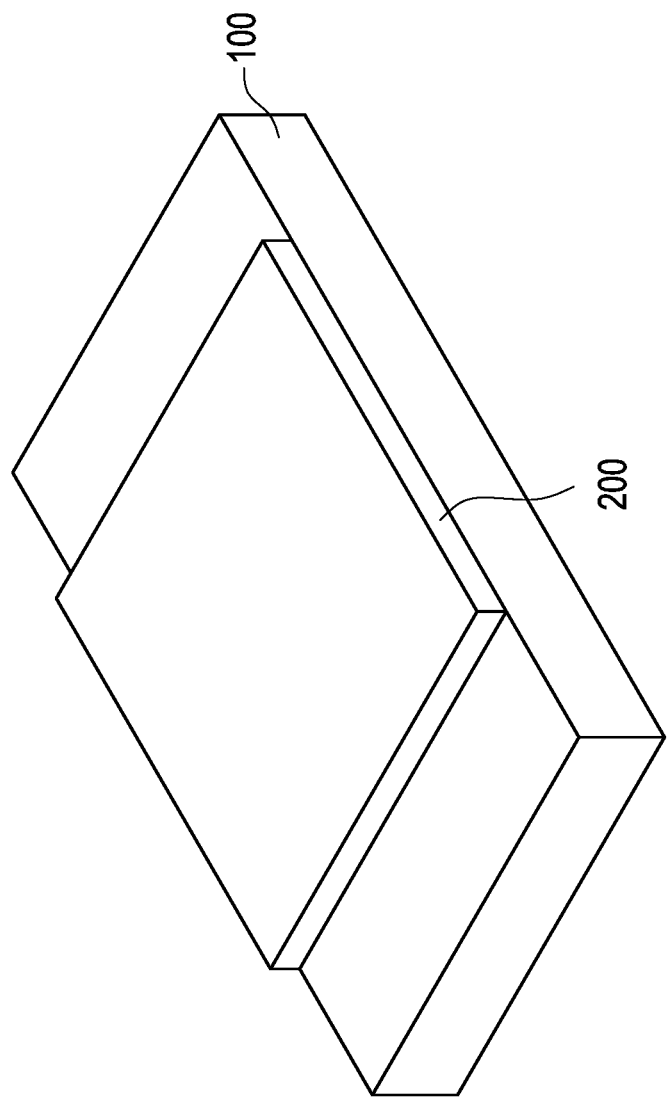

Referring to FIG. 2B, a portion of the insulating layer 200 is removed to partially expose the underlying dielectric layer 100. In other words, the insulating layer 200 partially covers the underlying dielectric layer 100. In some embodiments, the insulating layer 200 is patterned through a photolithography and etching process. For example, a patterned photoresist layer (not shown) is formed on the insulating layer 200 shown in FIG. 1A to define the shape of the insulating layer 200 shown in FIG. 2B. Thereafter, an etching process is performed to remove the insulating layer 200 that is not covered by the patterned photoresist layer. The etching process includes, for example, an anisotropic etching process such as dry etch or an isotropic etching process such as wet etch. Subsequently, the patterned photoresist layer is removed through a stripping process or the like to expose the remaining insulating layer 200.

Figure 2C:
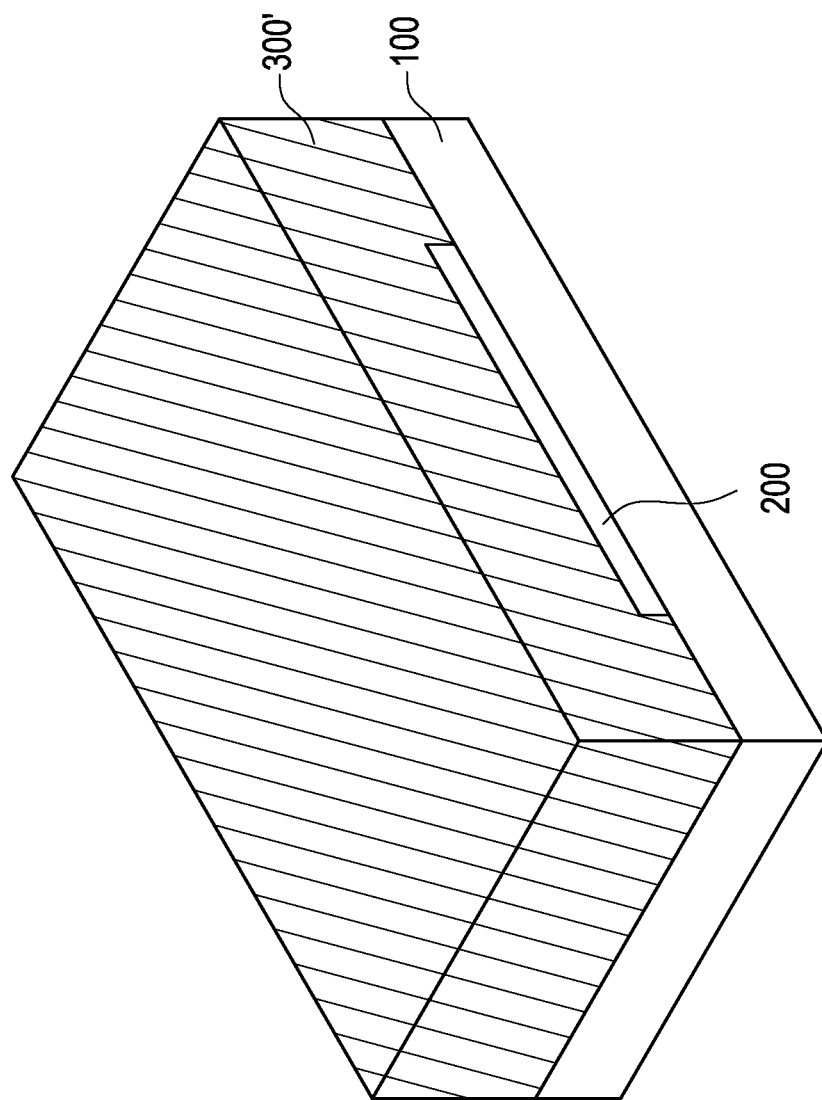

Referring to FIG. 2C, a source/drain material layer 300' is formed on the dielectric layer 100 and the insulating layer 200. In some embodiments, the source/drain material layer 300' covers the top surface of the dielectric layer 100. Meanwhile, the source/drain material layer 300' also covers a top surface and sidewalls of the insulating layer 200. For example, the source/drain material layer 300' exhibits an upside down U-shape when viewing from a side. In some embodiments, the source/drain material layer 300' is made of cobalt, tungsten, copper, titanium, tantalum, aluminum, zirconium, hafnium, a combination thereof, or other suitable metallic materials. In some embodiments, the source/drain material layer 300' is formed through CVD, atomic layer deposition (ALD), plating, or other suitable deposition techniques.

Figure 2D:
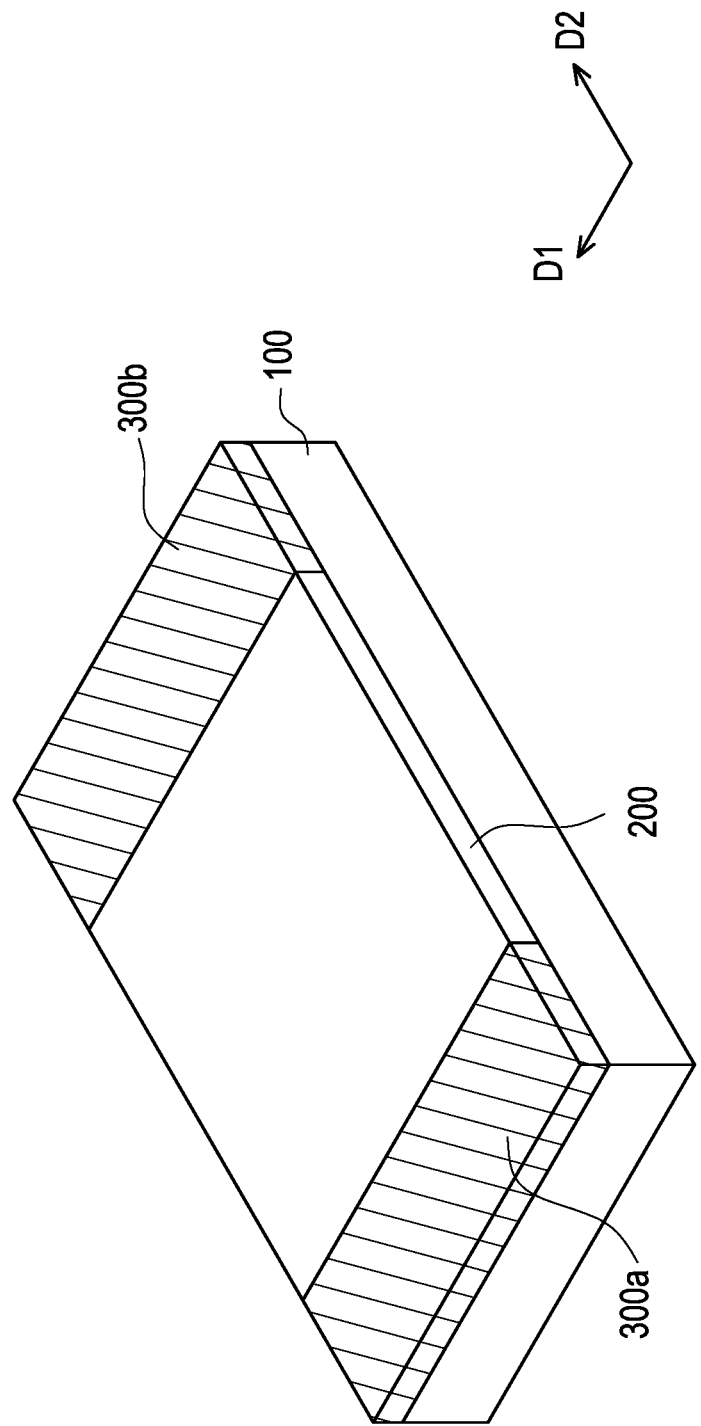

Referring to FIG. 2C and FIG. 2D, a portion of the source/drain material layer 300' is removed to form a source region 300a and a drain region 300b. For example, the source/drain material layer 300' in FIG. 2C is thinned until the underlying insulating layer 200 is exposed, so as to form the source region 300a and the drain region 300b. In some embodiments, the source/drain material layer 300' is thinned through a grinding process, such as a mechanical grinding process, a chemical mechanical polishing (CMP) process, or the like. After grinding, a top surface of the source region 300a, a top surface of the drain region 300b, and a top surface of the insulting layer 200 are substantially coplanar. In some embodiments, after the insulating layer 200 is exposed, the source region 300a, the drain region 300b, and the insulating layer 200 may be further grinded to reduce the total thickness of the subsequently formed second transistor T2. As illustrated in FIG. 2D, the source region 300a and the drain region 300b are respective formed on two opposite ends of the insulating layer 200. For example, the source region 300a and the drain 300b are respectively in physical contact with opposite sidewalls of the insulating layer 200. That is, the insulating layer 200 is sandwiched between the source region 300a and the drain region 300b to electrically isolate the source region 300a and the drain region 300b. In some embodiments, the source region 300a extends along a first direction D1. Similarly, the drain region 300b also extends along the first direction D1. In other words, the source region 300a is parallel to the drain region 300b. On the other hand, the insulating layer 200 extends from the source region 300a to the drain region 300b along a second direction D2 perpendicular to the first direction D1.

Figure 2E:
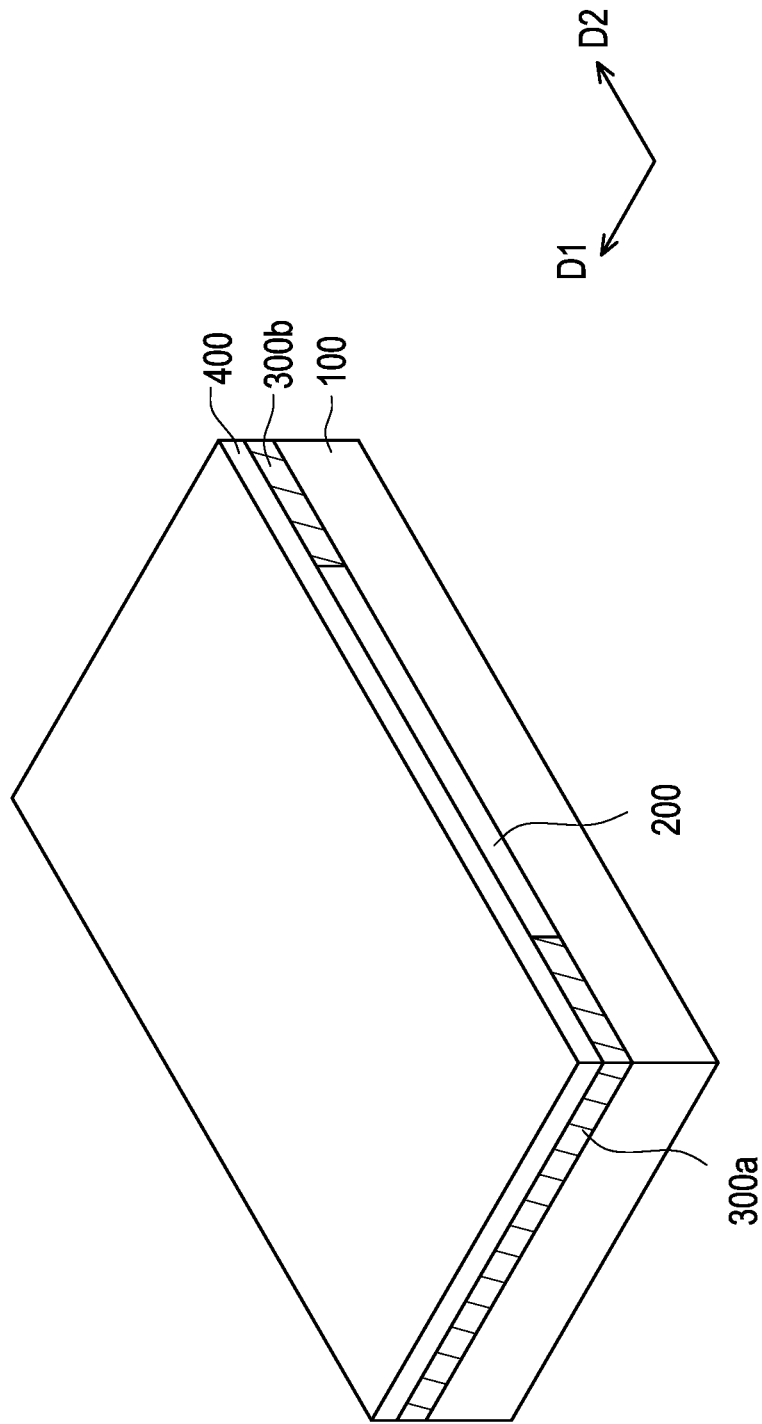
Figure 3:
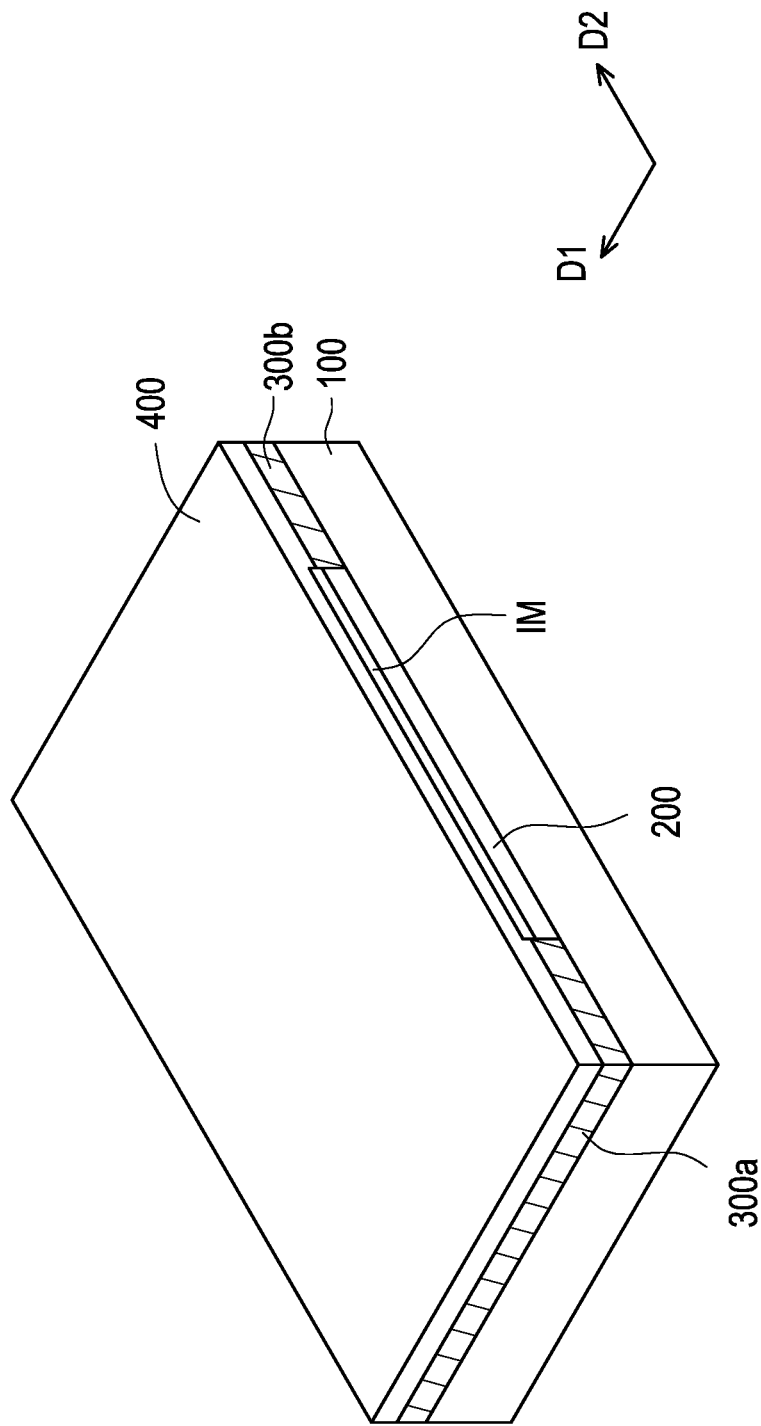
FIG. 3 is a schematic perspective view illustrating an intermediate stage of the manufacturing method of the second transistor in accordance with some alternative embodiments.

Referring to FIG. 2E, a channel layer 400 is deposited on the source region 300a, the drain region 300b, and the insulating layer 200. For example, the channel layer 400 is in physical contact with top surfaces of the source region 300a, the drain region 300b, and the insulating layer 200. In some embodiments, the channel layer 400 includes metal oxide materials. Examples of the metal oxide materials include $ITZO_x$, $IGZO_x$, $TZO_x$, $ATZO_x$, $ZnO_x$, the like, or a combination thereof. In some embodiments, these metal oxide materials are also being referred to as oxide semiconductor materials. In some embodiments, the channel layer 400 is made of a single layer having one of the foregoing materials. However, the disclosure is not limited thereto. In some alternative embodiments, the channel layer 400 may be made of a laminate structure of at least two of the foregoing materials. In some embodiments, the channel layer 400 is doped with a dopant to achieve extra stability. In some embodiments, the channel layer 400 is deposited by suitable techniques, such as CVD, ALD, physical vapor deposition (PVD), PECVD, epitaxial growth, or the like. As mentioned above, the channel layer 400 is formed such that the channel layer 400 is in physical contact with the top surface of the insulating layer 200. However, the disclosure is not limited thereto. In some alternative embodiments, depending on the material of the insulating layer 200 and the material of the channel layer 400, another layer may be generated between the channel layer 400 and the insulating layer 200 during the deposition of the channel layer 400. Such scenario is shown in FIG. 3, which is a schematic perspective view illustrating an intermediate stage of the manufacturing method of the second transistor T2 in accordance with some alternative embodiments. Referring to FIG. 3, an intermixing layer IM is formed between the overlapping region of the insulating layer 200 and the channel layer 400. For example, during the formation of the channel layer 400, the material of the channel layer 400 would react with the material of the insulating layer 200 to form the intermixing layer IM. In some embodiments, a portion of the insulating layer 200 is being consumed during the reaction to form the intermixing layer IM. As such, as illustrated in FIG. 3, the top surface of the insulating layer 200 is located at a level height lower than that of the top surface of the source region 300a and the top surface of the drain region 300b. On the other hand, a top surface of the intermixing layer IM is located at a level height higher than that of the top surface of the source region 300a and the top surface of the drain region 300b. As illustrated in FIG. 3, the channel layer 400 is in physical contact with top surfaces of the source region 300a, the intermixing layer IM, and the drain region 300b. In some embodiments, the material of the intermixing layer IM includes $ITZO_x$, $IGZO_x$, $TZO_x$, $ATZO_x$, $ZnO_x$, a combination thereof, or the like.

Figure 2F:
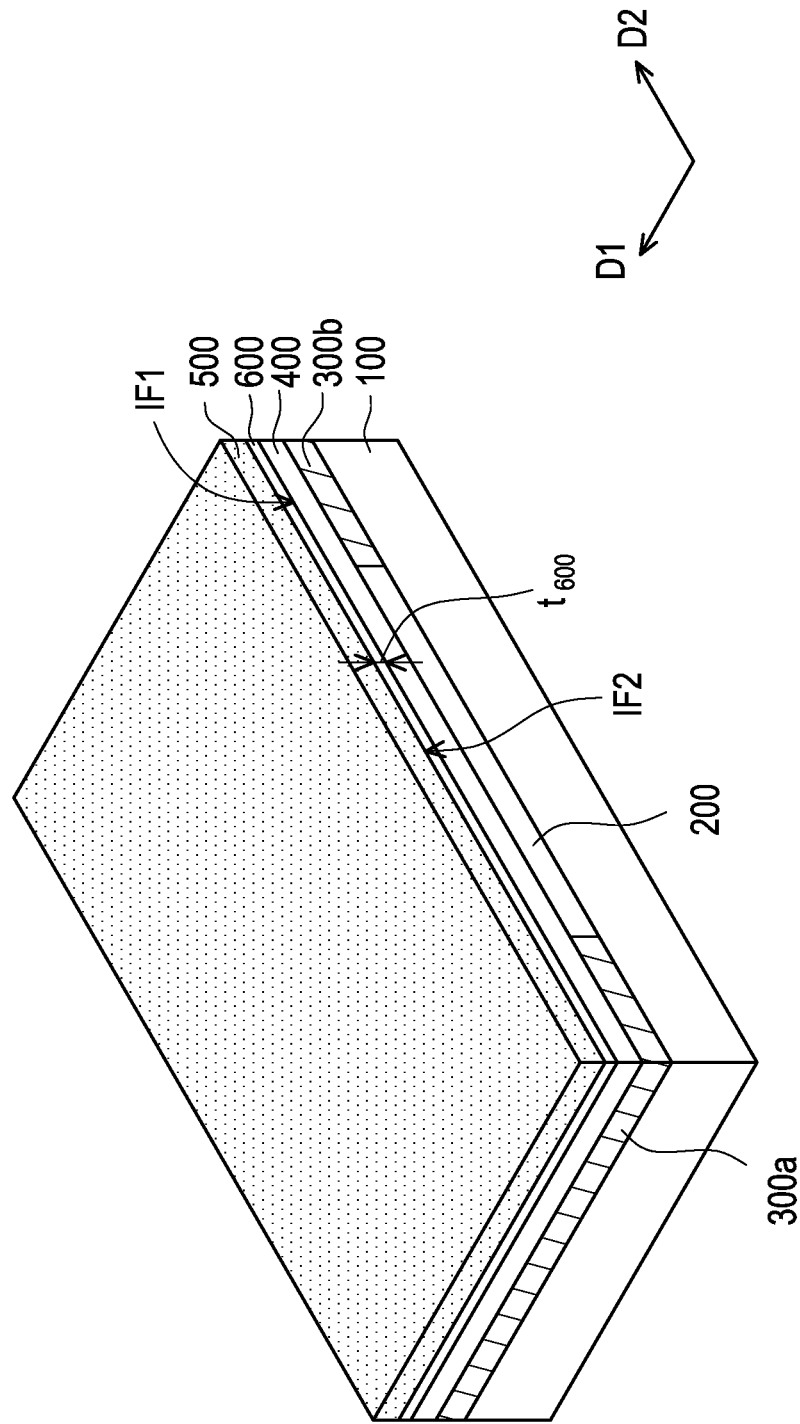

Referring to FIG. 2F, a ferroelectric layer 500 is formed over the channel layer 400. In some embodiments, a material of the ferroelectric layer 500 includes $AlO_x$, $HfO_x$, $HfZrO_x$, $SiO_x$, a combination thereof, or the like. In some embodiments, the ferroelectric layer 500 is formed through a non-plasma deposition process. The non-plasma deposition process denotes a deposition process which does not involve the introduction of plasma. The non-plasma deposition process includes, for example, ALD, CVD, or the like. In some embodiments, the ferroelectric layer 500 is deposited at a temperature ranging from about 200° C. to about 400° C. In some embodiments, since the ferroelectric layer 500 is formed through the non-plasma deposition process, during the formation of the ferroelectric layer 500, the material of the ferroelectric layer 500 would react with the material of the channel layer 400 to form an interfacial layer 600 between the channel layer 400 and the ferroelectric layer 500. In other words, the interfacial layer 600 is sandwiched between the channel layer 400 and the ferroelectric layer 500. For example, the interfacial layer 600 is in physical contact with a top surface of the channel layer 400 and a bottom surface of the ferroelectric layer 500.

In some embodiments, the interfacial layer 600 is a byproduct layer generated from the formation of the ferroelectric layer 500, so the thickness $t_{600}$ of the interfacial layer 600 is small. For example, the interfacial layer 600 is formed to have the thickness $t_{600}$ of about 1 nm to about 5 nm.

In some embodiments, a material of the interfacial layer 600 includes $ITO_y$, $ZnO_y$, $HfZrO_y$, a combination thereof, or the like. In some embodiments, since the interfacial layer 600 is a product of the reaction between the material of the channel layer 400 and the material of the ferroelectric layer 500, the precursors of the interfacial layer 600 are originated from the channel layer 400 and the ferroelectric layer 500. That is, the interfacial layer 600 includes chemical elements that are originated from the chemical elements of the channel layer 400 and the chemical elements of the ferroelectric layer 500. However, since the material of the channel layer 400 and the material of the ferroelectric layer 500 undergo a reaction, the resulting material (i.e. the material of the interfacial layer 600) is different from the material of the channel layer 400 and the material of the ferroelectric layer 500. In some embodiments, the material of the interfacial layer 600 includes chemical elements that are different from the chemical elements of the material of channel layer 400 and the chemical elements of the material of the ferroelectric layer 500. For example, when the channel layer 400 is formed of $ITZO_x$, the resulting interfacial layer 600 may be made of $ITO_y$, in which the indium atom, the tin atom, and the oxygen atoms are coming from the ITZO of the channel layer 400. However, the disclosure is not limited thereto. In some alternative embodiments, the material of the interfacial layer 500 may include chemical elements that are the same as the chemical elements of the material of the channel layer 500 or the chemical elements of the material of the ferroelectric layer 500, but with different elemental compositions. For example, when the ferroelectric layer 500 is formed of $HfZrO_x$, the resulting interfacial layer 600 may be made of $HfZrO_y$, where x is different from y. It should be noted that although the chemical elements in the ferroelectric layer 500 and the interfacial layer 600 are the same, due to the difference in elemental compositions, the material of the interfacial layer 600 is still being considered as different from the material of the ferroelectric layer 500.

In some embodiments, since the interfacial layer 600 and the channel layer 400 are made of different materials, a first interface IF1 exists between the interfacial layer 600 and the channel layer 400. Similarly, since the interfacial layer 600 and the ferroelectric layer 500 are made of different materials, a second interface IF2 exists between the interfacial layer 600 and the ferroelectric layer 500.

Conventionally, the ferroelectric layer is formed by a plasma deposition process such as PVD or PECVD. However, with the presence of plasma, the underlying channel layer would be damaged during the formation of the ferroelectric layer. For example, the plasma bombardment on the channel layer during the formation of the ferroelectric layer would damage the channel layer, thereby causing defects. When the channel width is too big, the defects in the channel layer cannot be fully removed/recovered by the subsequent annealing process. The defects in the channel layer would result in gate leakage, which causes degrades in current on/off ratio ($I_{on}/I_{off}$ ratio). As a result, the performance of the subsequently formed transistor is compromised. However, as mentioned above, the ferroelectric layer 500 is formed by a non-plasma deposition process. Therefore, the plasma-induced defect can be reduced significantly or even eliminated. With further annealing in the subsequent processes, the defects coming from other processes can be removed/recovered, thereby rendering a substantially defect-free channel layer 400. As a result, the degradation of the $I_{on}/I_{off}$ ratio may be prevented, and the performance of the subsequently formed second transistor T2 may be ensured.

Figure 2G:
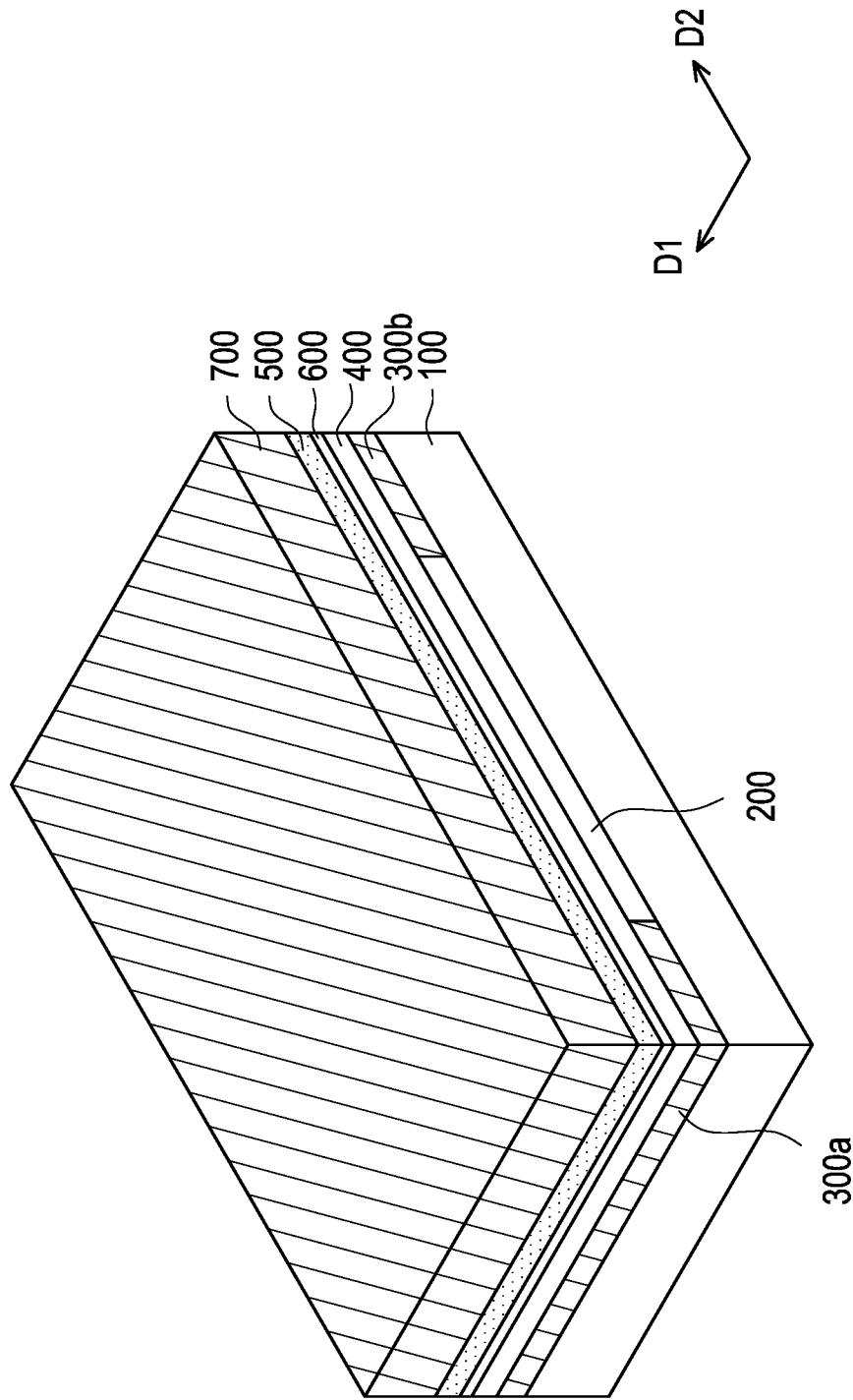

Referring to FIG. 2G, a gate electrode 700 is formed on the ferroelectric layer 500. In some embodiments, the gate electrode 700 is formed on the ferroelectric layer 500 such that the top surface of the ferroelectric layer 500 is covered by the gate electrode 700. In some embodiments, the gate electrode includes a metallic material. The metallic material of the gate electrode 700 includes copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. In some embodiments, the gate electrode 700 also includes materials to fine-tune the corresponding work function. For example, the metallic material of the gate electrode 700 may include p-type work function materials such as Ru, Mo, WN, $ZrSi_2$, $MoSi_2$, $TaSi_2$, $NiSi_2$, or combinations thereof, or n-type work function materials such as Ag, TaCN, Mn, or combinations thereof. In some embodiments, the metallic material is deposited through ALD, CVD, PVD, or the like.

In some embodiments, a barrier layer (not shown) is optionally formed between the gate electrode 700 and the ferroelectric layer 500, so as to avoid diffusion of atoms between elements. In some embodiments, a material of the barrier layer includes titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), or a combination thereof.

Figure 2H:
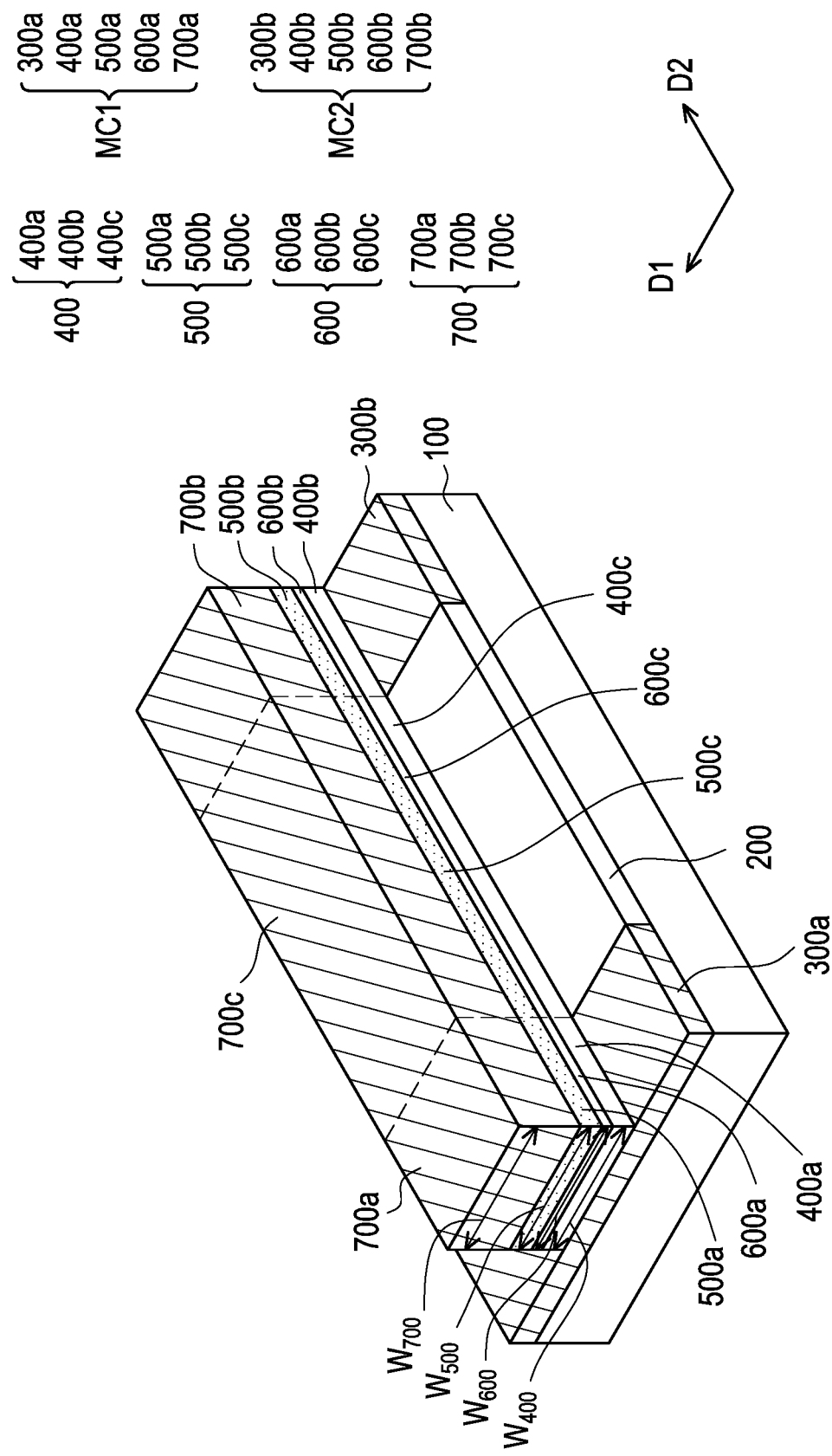

Referring to FIG. 2G and FIG. 2H, the gate electrode 700, the ferroelectric layer 500, the interfacial layer 600, and the channel layer 400 are patterned to expose at least a portion of the source region 300a, at least a portion of the drain region 300b, and at least a portion of the insulating layer 200. In some embodiments, the gate electrode 700, the ferroelectric layer 500, the interfacial layer 600, and the channel layer 400 are patterned through a photolithography and etching process. For example, a patterned photoresist layer (not shown) is formed on the gate electrode 700 shown in FIG. 2G to define the shape of the gate electrode 700, the ferroelectric layer 500, the interfacial layer 600, and the channel layer 400 shown in FIG. 2H. Thereafter, an etching process is performed to remove the gate electrode 700, the ferroelectric layer 500, the interfacial layer 600, and the channel layer 400 that are not covered by the patterned photoresist layer. The etching process includes, for example, an anisotropic etching process such as dry etch or an isotropic etching process such as wet etch. Then, the patterned photoresist layer is removed through a stripping process or the like to obtain the gate electrode 700, the ferroelectric layer 500, the interfacial layer 600, and the channel layer 400 shown in FIG. 2H. In some embodiments, the gate electrode 700, the ferroelectric layer 500, the interfacial layer 600, and the channel layer 400 are patterned simultaneously through the same process, so a contour of the channel layer 400, a contour of the interfacial layer 600, a contour of the ferroelectric layer 500, and a contour of the gate electrode 700 are substantially identical. In other words, sidewalls of the channel layer 400, sidewalls of the ferroelectric layer 500, sidewalls of the interfacial layer 600, and sidewalls of the gate electrode 700 are aligned. In some embodiments, a width $W_{400}$ of the channel layer 400, a width $W_{600}$ of the interfacial layer 600, a width $W_{500}$ of the ferroelectric layer 500, and a width $W_{700}$ of the gate electrode 700 are substantially the same. As mentioned above, since the ferroelectric layer 500 is formed by a non-plasma process, the channel width (i.e. the width $W_{400}$) can be as large as possible without considering the ability to remove the defects in the subsequent annealing process. For example, the width $W_{400}$ of the channel layer 400, the width $W_{600}$ of the interfacial layer 600, the width $W_{500}$ of the ferroelectric layer 500, and the width $W_{700}$ of the gate electrode 700 range from about 0.2 μm to about 10 μm.

In some embodiments, the channel layer 400, the interfacial layer 600, the ferroelectric layer 500, and the gate electrode 700 are sequentially stacked on the source region 300a, the drain region 300b, and the insulating layer 200. In some embodiments, since the ferroelectric layer 500 is disposed between the channel layer 400 and the gate electrode 700, the ferroelectric layer 500 may serve as a gate dielectric layer in the subsequently formed second transistor T2. As illustrated in FIG. 2H, the channel layer 400, the interfacial layer 600, the ferroelectric layer 500, and the gate electrode 700 extend along a second direction D2 perpendicular to the first direction D1. Since the source region 300a and the drain region 300b extend along the first direction D1, the channel layer 400, the interfacial layer 600, the ferroelectric layer 500, and the gate electrode 700 are arranged perpendicular to the source region 300a and the drain region 300b. For example, the channel layer 400, the interfacial layer 600, the ferroelectric layer 500, and the gate electrode 700 extend from the source region 300a to the drain region 300b, as illustrated in FIG. 2H.

In some embodiments, the channel layer 400 is divided into a first portion 400a, a second portion 400b, and a third portion 400c connecting the first portion 400a and the second portion 400b. In some embodiments, the first portion 400a of the channel layer 400 is located directly above the source region 300a, the second portion 400b of the channel layer 400 is located directly above the drain region 300b, and the third portion 400c of the channel layer 400 is located directly above the insulating layer 200. Similarly, the interfacial layer 600 is also divided into a first portion 600a, a second portion 600b, and a third portion 600c connecting the first portion 600a and the second portion 600b. In some embodiments, the source region 300a and the first portion 400a of the channel layer 400 are located directly underneath the first portion 600a of the interfacial layer 600. The drain region 300b, the second portion 400b of the channel layer 400 are located directly underneath the second portion 600b of the interfacial layer 600. Moreover, the insulating layer 200 and the third portion 400c of the channel layer 400 are located directly underneath the third portion 600c of the interfacial layer 600. In some embodiments, the ferroelectric layer 500 is also divided into a first portion 500a, a second portion 500b, and a third portion 500c connecting the first portion 500a and the second portion 500b. In some embodiments, the source region 300a, the first portion 400a of the channel layer 400, and the first portion 600a of the interfacial layer 600 are located directly underneath the first portion 500a of the ferroelectric layer 500. The drain region 300b, the second portion 400b of the channel layer 400, and the second portion 600b of the interfacial layer 600 are located directly underneath the second portion 500b of the ferroelectric layer 500. Moreover, the insulating layer 200, the third portion 400c of the channel layer 400, and the third portion 600c of the interfacial layer 600 are located directly underneath the third portion 500c of the ferroelectric layer 500. In some embodiments, the gate electrode 700 is also divided into a first portion 700a, a second portion 700b, and a third portion 700c connecting the first portion 700a and the second portion 700b. In some embodiments, the source region 300a, the first portion 400a of the channel layer 400, the first portion 600a of the interfacial layer 600, and the first portion of the ferroelectric layer 500 are located directly underneath the first portion 700a of the gate electrode 700. The drain region 300b, the second portion 400b of the channel layer 400, the second portion 600b of the interfacial layer 600, and the second portion 500b of the ferroelectric layer 500 are located directly underneath the second portion 700b of the gate electrode 700. Moreover, the insulating layer 200, the third portion 400c of the channel layer 400, the third portion 600c of the interfacial layer 600, and the third portion 500c of the ferroelectric layer 500 are located directly underneath the third portion 700c of the gate electrode 700.

As illustrated in FIG. 2H, the first portion 400a of the channel layer 400, the first portion 600a of the interfacial layer 600, the first portion 500a of the ferroelectric layer 500, and the first portion 700a of the gate electrode 700 are located directly above the source region 300a. In other words, the first portion 400a of the channel layer 400, the first portion 600a of the interfacial layer 600, the first portion 500a of the ferroelectric layer 500, and the first portion 700a of the gate electrode 700 are sequentially stacked on the source region 300a. For example, the source region 300a, the first portion 400a of the channel layer 400, the first portion 600a of the interfacial layer 600, the first portion 500a of the ferroelectric layer 500, and the first portion 700a of the gate electrode 700 are vertically overlapped with one another. Similarly, the second portion 400b of the channel layer 400, the second portion 600b of the interfacial layer 600, the second portion 500b of the ferroelectric layer 500, and the second portion 700b of the gate electrode 700 are located directly above the drain region 300b. In other words, the second portion 400b of the channel layer 400, the second portion 600b of the interfacial layer 600, the second portion 500b of the ferroelectric layer 500, and the second portion 700b of the gate electrode 700 are sequentially stacked on the drain region 300b. For example, the drain region 300b, the second portion 400b of the channel layer 400, the second portion 600b of the interfacial layer 600, the second portion 500b of the ferroelectric layer 500, and the second portion 700b of the gate electrode 700 are vertically overlapped with one another. Moreover, the third portion 400c of the channel layer 400, the third portion 600c of the interfacial layer 600, the third portion 500c of the ferroelectric layer 500, and the third portion 700c of the gate electrode 700 are located directly above the insulating layer 200. In other words, the third portion 400c of the channel layer 400, the third portion 600c of the interfacial layer 600, the third portion 500c of the ferroelectric layer 500, and the third portion 700c of the gate electrode 700 are sequentially stacked on the insulating layer 200. For example, the insulating layer 200, the third portion 400c of the channel layer 400, the third portion 600c of the interfacial layer 600, the third portion 500c of the ferroelectric layer 500, and the third portion 700c of the gate electrode 700 are vertically overlapped with one another. In some embodiments, the overlapping of these elements allows the formation of memory cells in the subsequently formed second transistor T2. That is, memory cells are integrated within the second transistor T2. The configurations of these memory cells will be described below.

In some embodiments, the source region 300a, the first portion 400a of the channel layer 400, the first portion 600a of the interfacial layer 600, the first portion 500a of the ferroelectric layer 500, and the first portion 700a of the gate electrode 700 collectively form a first memory cell MC1. On the other hand, the drain region 300b, the second portion 400b of the channel layer 400, the second portion 600b of the interfacial layer 600, the second portion 500b of the ferroelectric layer 500, and the second portion 700b of the gate electrode 700 collectively form a second memory cell MC2 that is spatially apart from the first memory cell MC1. In some embodiments, due to its material characteristics, the ferroelectric layer 500 may be utilized to trap electrons. For example, the ferroelectric layer 500 may be utilized to store data. As such, in some embodiments, the ferroelectric layer 500 is referred to as a "storage layer." In some embodiments, the source region 300a and the first portion 700a of the gate electrode 700 respectively serve as a bottom electrode and a top electrode of the first memory cell MC1. Meanwhile, the first portion 500a of the ferroelectric layer 500 may serve as a storage layer of the first memory cell MC1. Similarly, the drain region 300b and the second portion 700b of the gate electrode 700 respectively serve as a bottom electrode and a top electrode of the second memory cell MC2. Meanwhile, the second portion 500b of the ferroelectric layer 500 may serve as a storage layer of the second memory cell MC2. In some embodiments, since the storage layers of the first memory cell MC1 and the second memory cell MC2 are made of ferroelectric materials, the first memory cell MC1 and the second memory cell MC2 may be considered as memory cells for a FeRAM (Ferroelectric Random Access Memory).

In some embodiments, after the gate electrode 700, the ferroelectric layer 500, the interfacial layer 600, and the channel layer 400 are patterned, an annealing process is performed on the structure illustrated in FIG. 2H to remove defects in the channel layer 400 originated from processes other than the deposition of the ferroelectric layer 500. In some embodiments, the annealing process includes a rapid thermal annealing process followed by a laser annealing process. In some embodiments, the annealing process is performed in a chamber filled with $O_2$ gas, $N_2$ gas, or a combination thereof. In some embodiments, after the annealing process, the channel layer 400 is substantially defect-free.

Figure 2I:
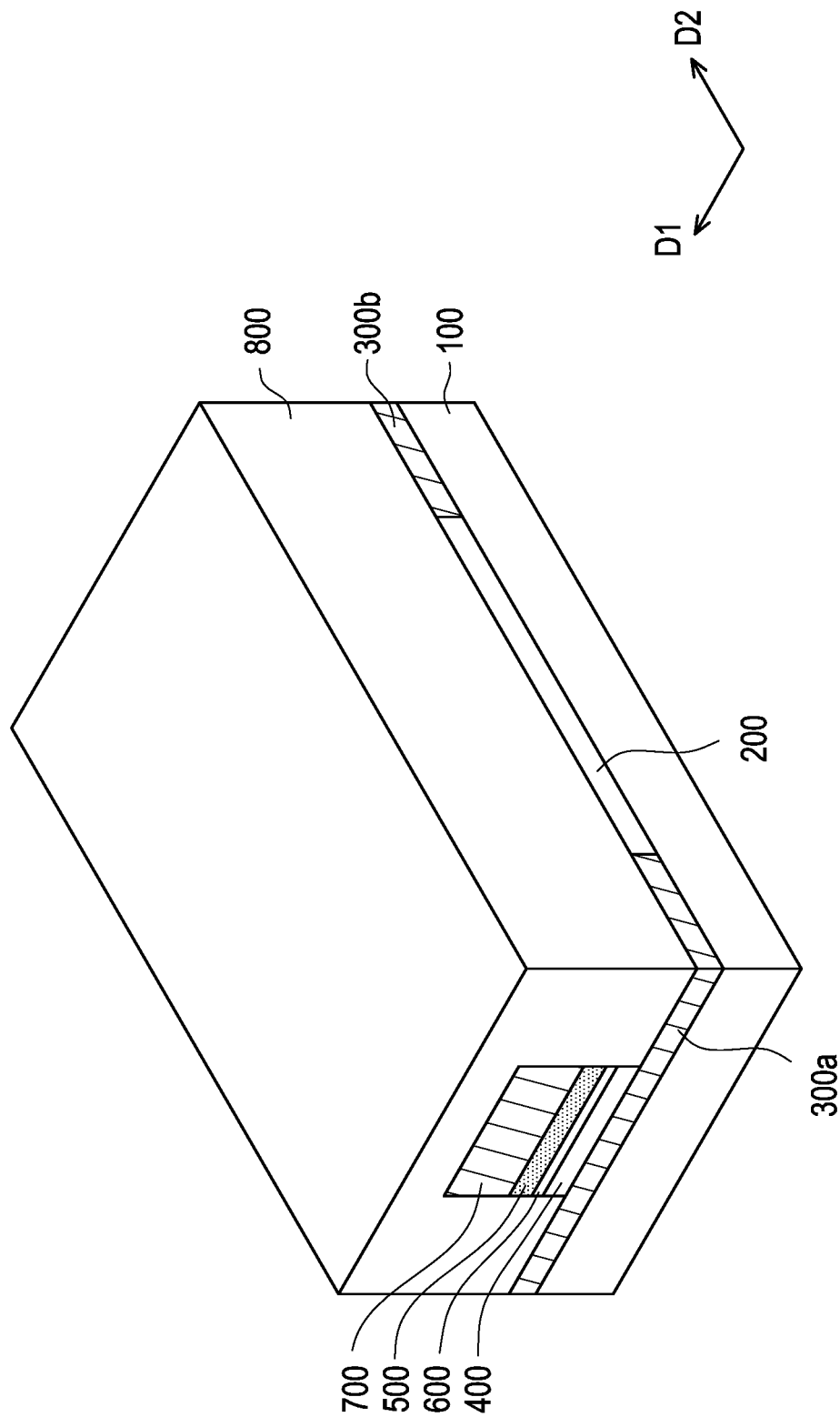

Referring to FIG. 2H and FIG. 2I, an interlayer dielectric layer 800 is formed on the insulating layer 200, the source region 300a, the drain region 300b, the channel layer 400, the interfacial layer 600, the ferroelectric layer 500, and the gate electrode 700. For example, the interlayer dielectric layer 800 covers the exposed top surface of the insulating layer 200, the exposed top surface of the source region 300a, the exposed top surface of the drain region 300, and the top surface of the gate electrode 700. Meanwhile, the interlayer dielectric layer 800 also covers sidewalls of the channel layer 400, sidewalls of the interfacial layer 600, sidewalls of the ferroelectric layer 500, and sidewalls of the gate electrode 700. For example, the interlayer dielectric layer 800 exhibits an upside down U-shape when viewing from a side. In some embodiments, a material and a formation method of the interlayer dielectric layer 800 are similar to that of the dielectric layer 100 and/or the insulating layer 200, so the detailed descriptions thereof are omitted herein.

Figure 2J:
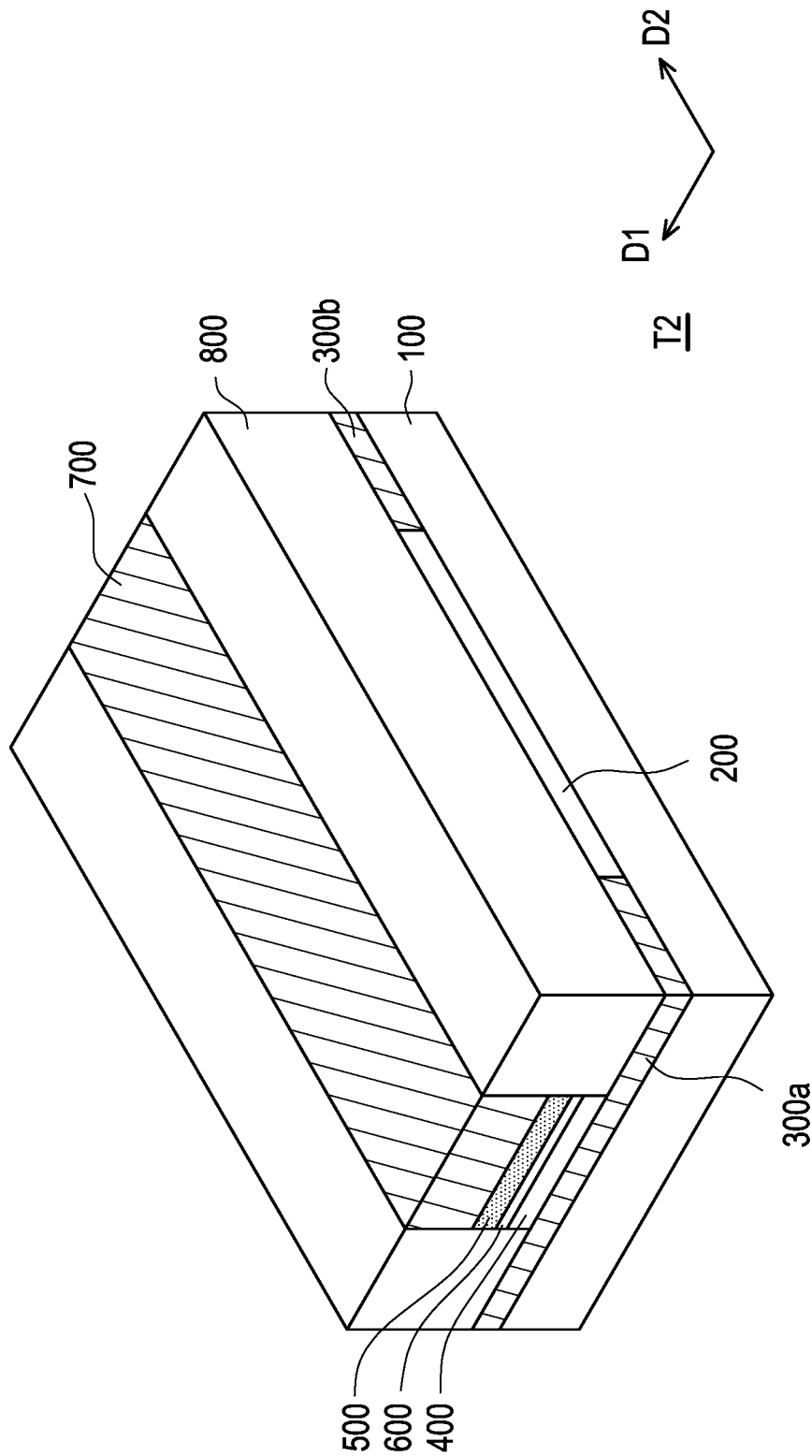

Referring to FIG. 2J, a portion of the interlayer dielectric layer 800 is removed to obtain the second transistor T2. For example, the interlayer dielectric layer 800 is thinned until the underlying gate electrode 700 is exposed. In some embodiments, the interlayer dielectric layer 800 is thinned through a grinding process, such as a mechanical grinding process, a CMP process, or the like. After grinding, a top surface of the gate electrode 700 is substantially coplanar with a top surface of the interlayer dielectric layer 800. In some embodiments, after the gate electrode 700 is exposed, the interlayer dielectric layer 800 and the gate electrode 700 may be further grinded to reduce the total thickness of the second transistor T2.

In some embodiments, since the second transistor T2 includes the ferroelectric layer 500, the second transistor T2 may be referred to as a FeFET (Ferroelectric Field-Effect Transistor). In some embodiments, source/drain contacts (not shown) are formed to penetrate through the interlayer dielectric layer 800, so as to connect the source region 300a/the drain region 300b with external elements. For example, referring to FIG. 2I and FIG. 1, some of the conductive vias 32 shown in FIG. 1 may serve as source/drain connects to electrically connect the source region 300a/the drain region 300b with the conductive patterns 34. Similarly, the conductive vias 32 may also serve as gate contacts that electrically connect the gate electrode 700 and the conductive patterns 34. In other words, the second transistor T2 is electrically connected to the first transistor T1 and the conductive terminals 70 through the conductive vias 32 and the conductive patterns 34 of the interconnection structure 30. In some embodiments, the second transistors T2 are embedded in the interconnection structure 30, which is being considered as formed during back-end-of-line (BEOL) processes. Please be noted that since the channel layer 400, the interfacial layer 600, the ferroelectric layer 500, and the gate electrode 700 are located behind the cross-sectional view in FIG. 1, these elements are shown by dotted line in FIG. 1.

As illustrated in FIG. 1, each second transistor T2 is a standalone transistor. However, the disclosure is not limited thereto. In some alternative embodiments, multiple second transistors T2 may be arranged in an array. The configurations of the transistor arrays will be described below in conjunction with FIG. 4 and FIG. 5.

Figure 4:
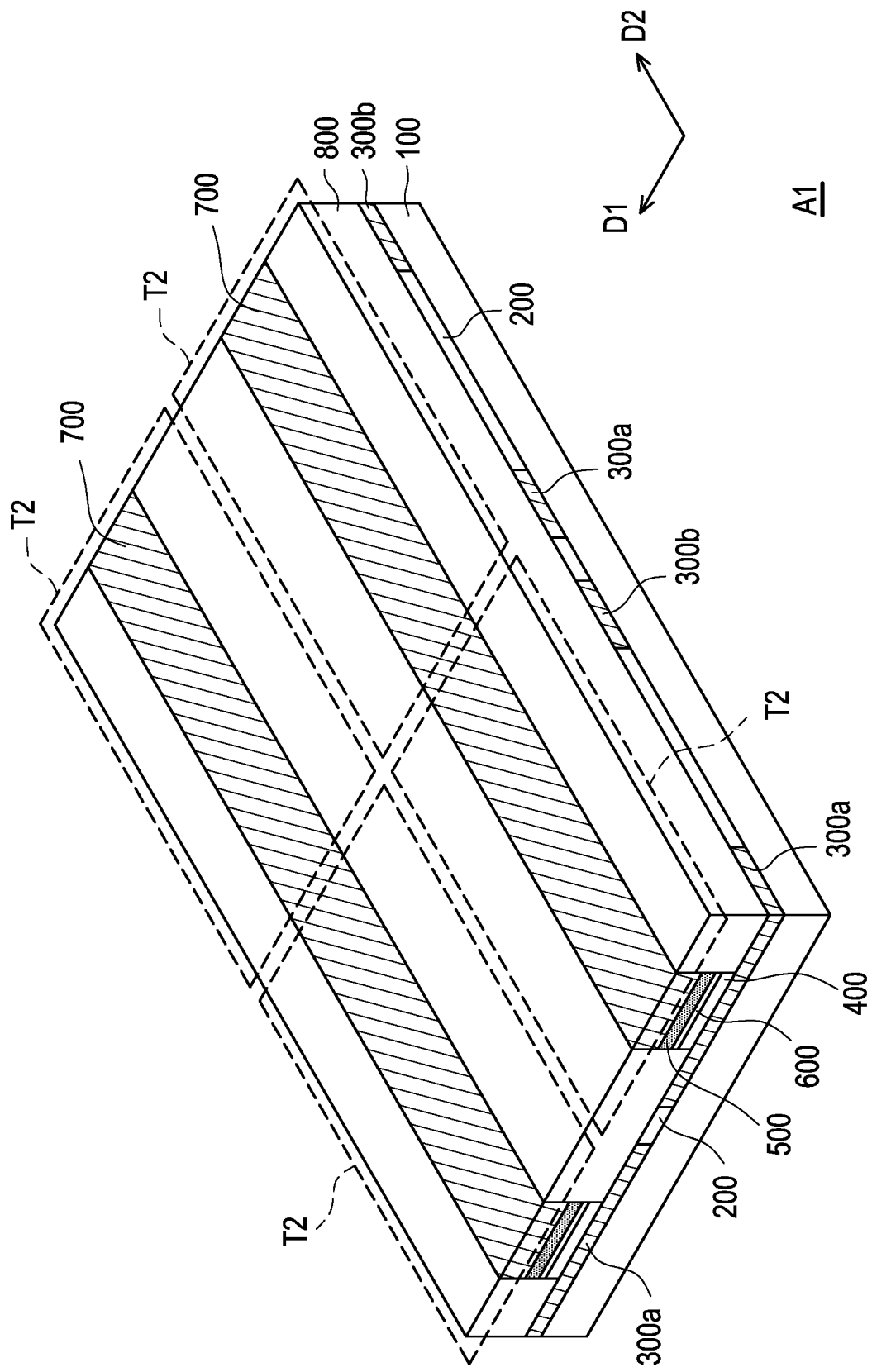
FIG. 4 is a schematic perspective view of a transistor array in accordance with some embodiments of the disclosure.

FIG. 4 is a schematic perspective view of a transistor array A1 in accordance with some embodiments of the disclosure. Referring to FIG. 4, the transistor array A1 includes four second transistors T2. In some embodiments, these four second transistors T2 are identical. In some embodiments, the source regions 300a and the drain regions 300b of these second transistors T2 are electrically isolated from one another by the insulating layer 200. On the other hand, two adjacent second transistors T2 arranged along the second direction D2 share the same gate electrode 700. In other words, the gate electrode 700 extends continuously from a second transistor T2 to an adjacent second transistor T2 along the second direction D2. For example, the gate electrodes 700 of two adjacent second transistors T2 arranged along the second direction D2 are electrically connected to each other. On the other hand, the gate electrodes 700 of two adjacent second transistors T2 arranged along the first direction D1 are electrically isolated from each other. As mentioned above, each second transistor T2 includes two memory cells (i.e. the first memory cell MC1 and the second memory cell MC2). Therefore, in the transistor array A1 of FIG. 4, eight memory cells are presented. As such, the transistor array A1 in FIG. 4 may be referred to as a memory array as well. Please be noted that although FIG. 4 illustrated that the transistor array A1 includes four second transistors T2, the disclosure is not limited thereto. In some alternative embodiments, the number of the second transistors T2 in the transistor array A1 may be adjusted based on demand.

Figure 5:
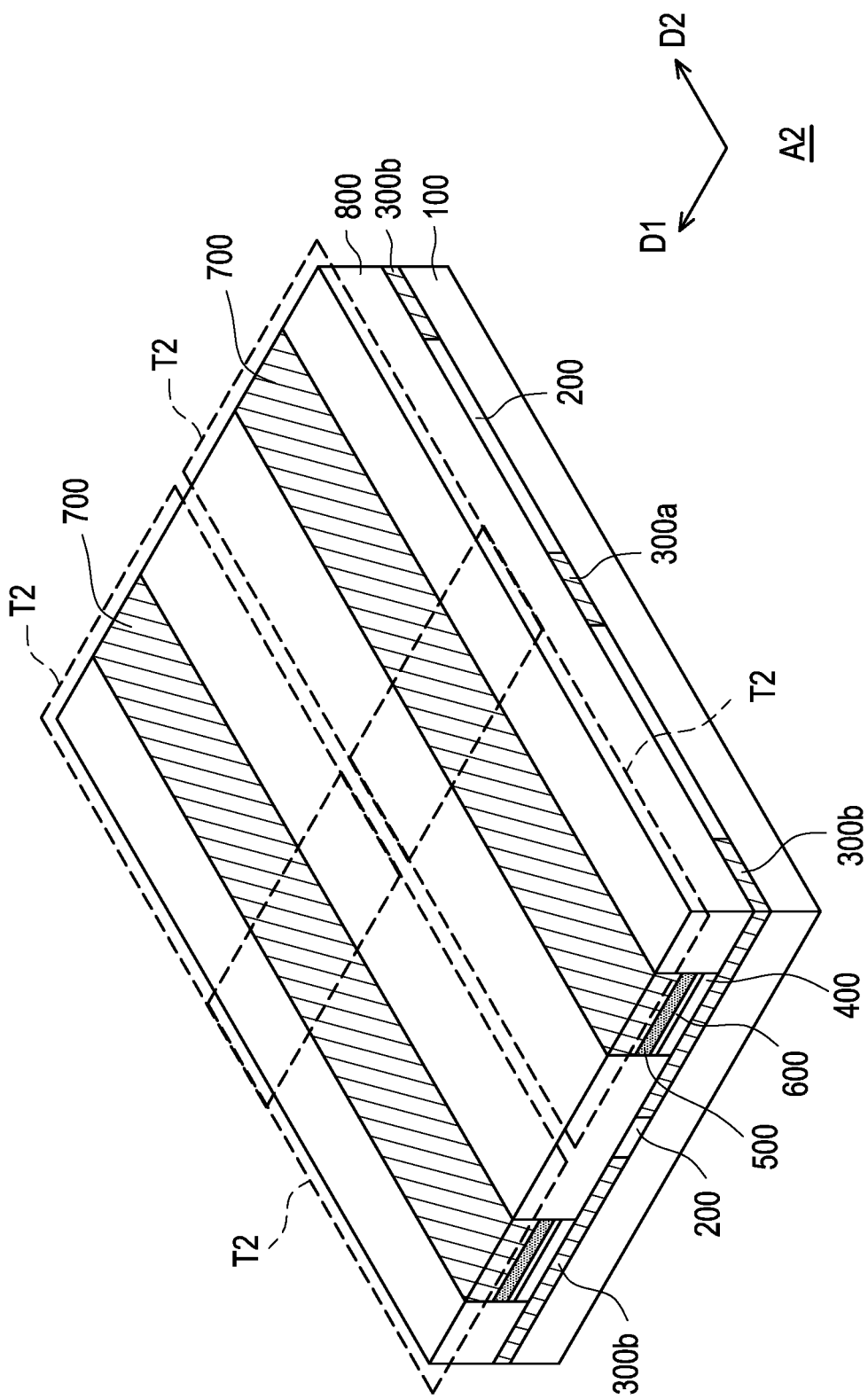
FIG. 5 is a schematic perspective view of a transistor array in accordance with some alternative embodiments of the disclosure.

FIG. 5 is a schematic perspective view of a transistor array A2 in accordance with some alternative embodiments of the disclosure. Referring to FIG. 5, the transistor array A2 includes four second transistors T2. In some embodiments, two adjacent second transistors T2 arranged along the second direction D2 share the same source region 300a. That is, two adjacent transistors T2 arranged along the second direction D2 are electrically connected to each other. Similarly, two adjacent second transistors T2 arranged along the second direction D2 share the same gate electrode 700. In other words, the gate electrode 700 extends continuously from a second transistor T2 to an adjacent second transistor T2 along the second direction D2. For example, the gate electrodes 700 of the two adjacent second transistors T2 arranged along the second direction D2 are electrically connected to each other. On the other hand, the gate electrodes 700 of the two adjacent second transistors T2 arranged along the first direction D1 are electrically isolated from each other. As mentioned above, each second transistor T2 includes two memory cells (i.e. the first memory cell MC1 and the second memory cell MC2). However, since two adjacent second transistors T2 arranged along the second direction D2 share the same memory cell, in the transistor array A2 of FIG. 5, six memory cells are presented. In some embodiments, the transistor array A2 in FIG. 5 may be referred to as a memory array as well. Please be noted that although FIG. 5 illustrated that the transistor array A2 includes four second transistors T2, the disclosure is not limited thereto. In some alternative embodiments, the number of the second transistors T2 in the transistor array A2 may be adjusted based on demand.

In accordance with some embodiments of the disclosure, a transistor includes an insulating layer, a source region, a drain region, a channel layer, a ferroelectric layer, an interfacial layer, and a gate electrode. The source region and the drain region are respectively disposed on two opposite ends of the insulating layer. The channel layer is disposed on the insulating layer, the source region, and the drain region. The ferroelectric layer is disposed over the channel layer. The interfacial layer is sandwiched between the channel layer and the ferroelectric layer. The gate electrode is disposed on the ferroelectric layer.

In accordance with some embodiments of the disclosure, an integrated circuit includes a substrate, a first transistor, and an interconnect structure. The first transistor is over the substrate. The interconnect structure is disposed on the substrate. The interconnect structure includes dielectric layers and at least one second transistor embedded in one of the dielectric layers. The second transistor includes a source region, a drain region, a channel layer, an interfacial layer, a storage layer, and a gate electrode. The source region and the drain region extend along a first direction. The channel layer, the interfacial layer, the storage layer, and the gate electrode are sequentially stacked on the source region and the drain region. The channel layer, the interfacial layer, the storage layer, and the gate electrode extend along a second direction perpendicular to the first direction.

In accordance with some embodiments of the disclosure, a manufacturing method of a transistor includes at least the following steps. A dielectric layer is provided. An insulating layer is formed to partially cover the dielectric layer. A source region and a drain region are formed on two opposite ends of the insulating layer. A channel layer is deposited on the insulating layer, the source region, and the drain region. A ferroelectric layer is formed over the channel layer through a non-plasma deposition process such that an interfacial layer is formed between the channel layer and the ferroelectric layer. A gate electrode is formed on the ferroelectric layer. The gate electrode, the ferroelectric layer, the interfacial layer, and the channel layer are patterned to expose at least a portion of the insulating layer, at least a portion of the source region, and at least a portion of the drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:
   an insulating layer;
   a source region and a drain region respectively disposed on and in physical contact with two opposite sidewalls of the insulating layer, wherein a top surface of the source region, a top surface of the drain region, and a top surface of the insulating layer are substantially coplanar;
   a channel layer disposed on the insulating layer, the source region, and the drain region;
   a ferroelectric layer disposed over the channel layer;
   an interfacial layer sandwiched between the channel layer and the ferroelectric layer; and
   a gate electrode disposed on the ferroelectric layer.

2. The transistor of claim 1, wherein a thickness of the interfacial layer ranges from about 1 nm to about 5 nm.

3. The transistor of claim 1, wherein a material of the interfacial layer is different from a material of the channel layer and a material of the ferroelectric layer.

4. The transistor of claim 1, wherein a first interface exists between the interfacial layer and the channel layer, a second interface exists between the interfacial layer and the ferroelectric layer, and the interfacial layer is in physical contact with both the channel layer and the ferroelectric layer.

5. The transistor of claim 1, wherein a material of the interfacial layer comprises ITO, ZnO, HfZrO, or a combination thereof.

6. The transistor of claim 1, wherein sidewalls of the channel layer, sidewalls of the interfacial layer, sidewalls of the ferroelectric layer, and sidewalls of the gate electrode are aligned.

7. The transistor of claim 1, further comprising an interlayer dielectric layer covering sidewalls of the channel layer, sidewalls of the interfacial layer, sidewalls of the ferroelectric layer, and sidewalls of the gate electrode.

8. An integrated circuit, comprising:
   a substrate;
   a first transistor over the substrate; and
   an interconnect structure disposed on the substrate, comprising:
      dielectric layers; and at least one second transistor embedded in one of the dielectric layers, comprising:
an insulating layer;
a source region and a drain region extending along a first direction, wherein the source region and the drain region are respectively disposed on and in physical contact with two opposite sidewalls of the insulating layer, and a top surface of the source region, a top surface of the drain region, and a top surface of the insulating layer are substantially coplanar;
a channel layer, an interfacial layer, a storage layer, and a gate electrode sequentially stacked on the insulating layer, the source region, and the drain region, wherein the channel layer, the interfacial layer, the storage layer, and the gate electrode extend along a second direction perpendicular to the first direction, the interfacial layer is sandwiched between the channel layer and the storage layer, and the storage layer is a ferroelectric layer.

9. The integrated circuit of claim 8, wherein a thickness of the interfacial layer ranges from about 1 nm to about 5 nm.

10. The integrated circuit of claim 8, wherein a material of the interfacial layer is different from a material of the channel layer and a material of the storage layer.

11. The integrated circuit of claim 8, wherein a material of the interfacial layer comprises ITO, ZnO, HfZrO, or a combination thereof.

12. The integrated circuit of claim 8, wherein the storage layer and the gate electrode respectively comprises a first portion, a second portion, and a third portion, the first portion of the storage layer and the first portion of the gate electrode are located directly above the source region, the second portion of the storage layer and the second portion of the gate electrode are located directly above the drain region, the third portion of the storage layer connects the first portion and the second portion of the storage layer, the third portion of the gate electrode connects the first portion and the second portion of the gate electrode, the source region, the first portion of the storage layer, and the first portion of the gate electrode form a first memory cell, and the drain region, the second portion of the storage layer, and the second portion of the gate electrode form a second memory cell.

13. The integrated circuit of claim 12, wherein the insulating layer is directly underneath the third portion of the storage layer and the third portion of the gate electrode, and the insulating layer electrically isolates the source region and the drain region.

14. The integrated circuit of claim 8, wherein the channel layer, the interfacial layer, the storage layer, and the gate electrode extend from the source region to the drain region.

15. The integrated circuit of claim 8, wherein a contour of the channel layer, a contour of the interfacial layer, a contour of the storage layer, and a contour of the gate electrode are substantially identical.

16. A manufacturing method of a transistor, comprising:
providing a dielectric layer;
forming an insulating layer to partially cover the dielectric layer;
forming a source region and a drain region on two opposite sidewalls of the insulating layer to be in physical contact with the two opposite sidewalls of the insulating layer, wherein a top surface of the source region, a top surface of the drain region, and a top surface of the insulating layer are substantially coplanar;
depositing a channel layer on the insulating layer, the source region, and the drain region;
forming a ferroelectric layer over the channel layer through a non-plasma deposition process such that an interfacial layer is formed between the channel layer and the ferroelectric layer;
forming a gate electrode on the ferroelectric layer; and
patterning the gate electrode, the ferroelectric layer, the interfacial layer, and the channel layer to expose at least a portion of the insulating layer, at least a portion of the source region and at least a portion of the drain region.

17. The method of claim 16, wherein the non-plasma deposition process comprises atomic layer deposition (ALD) or chemical vapor deposition (CVD).

18. The method of claim 16, wherein the interfacial layer is formed to have a thickness of about 1 nm to about 5 nm.

19. The method of claim 16, wherein forming the source region and the drain region comprises:
depositing a source/drain material layer on insulating layer and the dielectric layer; and
removing a portion of the source/drain material layer until the insulating layer is exposed, so as to form the source region and the drain region on two opposite ends of the insulating layer.

20. The method of claim 16, wherein the gate electrode, the ferroelectric layer, the interfacial layer, and the channel layer are patterned simultaneously through the same process.

* * * * *